(12) United States Patent
Bash et al.

(10) Patent No.: US 6,853,554 B2
(45) Date of Patent: Feb. 8, 2005

(54) THERMAL CONNECTION LAYER

(75) Inventors: Cullen E. Bash, San Francisco, CA (US); Chandrakant D. Patel, Fremont, CA (US); Glenn C. Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 161 days.

(21) Appl. No.: 10/022,112

(22) Filed: Dec. 14, 2001

(65) Prior Publication Data

US 2002/0114139 A1 Aug. 22, 2002

Related U.S. Application Data

(60) Provisional application No. 60/271,273, filed on Feb. 22, 2001.

(51) Int. Cl.[7] ................................................. H05K 7/20
(52) U.S. Cl. ...................... 361/699; 165/80.4; 165/80.2; 165/185; 257/719; 361/702; 361/705; 361/708; 361/710; 361/719; 361/720
(58) Field of Search ............................... 165/80.2, 80.3, 165/185; 174/16.3; 257/706–707, 712–713, 718–719, 726–727; 361/687–689, 696, 698–701, 712–713, 719–721

(56) References Cited

U.S. PATENT DOCUMENTS

| | | | | |
|---|---|---|---|---|
| 4,707,763 A | * | 11/1987 | Kudo | 361/708 |
| 5,381,304 A | * | 1/1995 | Theroux et al. | 361/706 |
| 5,403,973 A | * | 4/1995 | Santilli et al. | 361/720 |
| 5,812,372 A | * | 9/1998 | Galyon et al. | 361/699 |
| 6,101,094 A | * | 8/2000 | Kermaani et al. | 361/720 |

OTHER PUBLICATIONS

Herman W. Chu, Christian L. Belady and Chandrakant D. Patel, "A Survey of High–performance, High Aspect Ratio, Air Cooled Heat Sinks," International Systems and Packaging Symposium (1999).
Chandrakant D. Patel, "Backside Cooling Solution for High Power Flip Chip Multi–Chip Modules," IEEE ECTC Proceedings 442–449 (May, 1994).
R. Hannemann, L. R. Fox and M. Mahalingham, "Thermal Design for Microelectronic Components," in "Advances in Cooling Techniques for Computers" 245–276 (Win Aung ed., Hemisphere Publishing Corporation, 1991).
"Advances in Cooling Techniques for Computers" 150–153 (Win Aung ed., Hemisphere Publishing Corporation, 1991).
Robert Darveaux and Iwona Turlik, "Backside Cooling of Flip Chip Devices in Multichip Modules," ICMCM Proc. 230–241 (1992).
Copending U.S. Appl. No. 10/023,227, filed Dec. 14, 2001, Entitled "Thermal Connector for Cooling Electronics," Inventors: Cullen Bash, Chandrakant Patel, and Glenn Simon.
Copending U.S. Appl. No. 09/945,044, filed Aug. 31, 2001, Entitled "Modular Sprayjet Cooling System," Inventors: Cullen Bash, Abdlmonem Beitelmal, and Chandrakant Patel.

* cited by examiner

Primary Examiner—Gregory D Thompson

(57) ABSTRACT

A modular semiconductor chip cooling system having a readily openable enclosure defining a chamber configured to hold a printed circuit board carrying components to be cooled. The enclosure can include a reservoir, a condenser and a pump. Sprayers within the chamber are adjustably mounted on one or more brackets to allow each sprayer to be set for the individual height of its respective component. The enclosure can be readily removed from a computer system through a quick release connection. The computer system can include a condenser and pump to operate all its modular cooling systems, removing the condensing function from the individual modules.

33 Claims, 5 Drawing Sheets

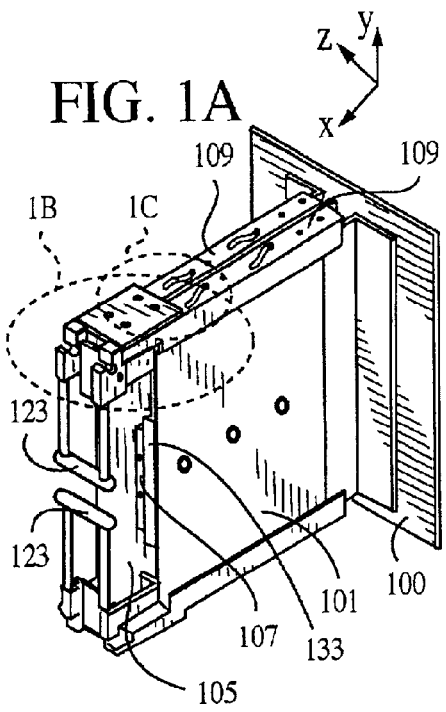
FIG. 1A
FIG. 1B
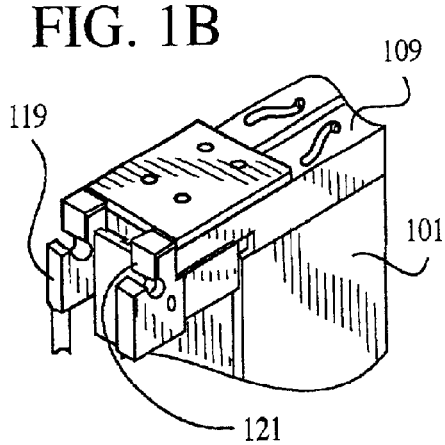
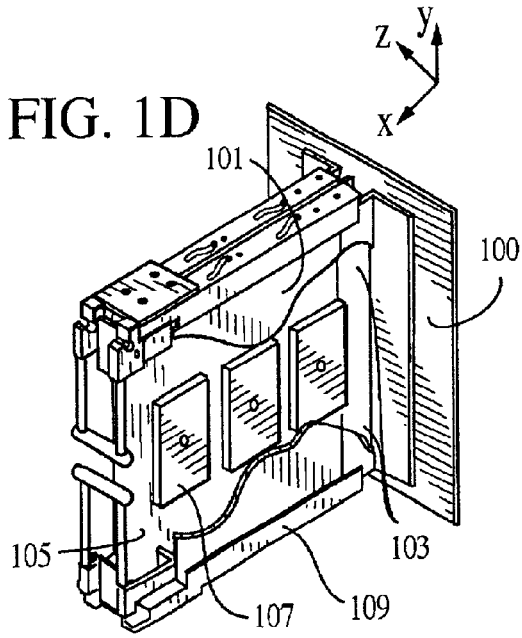
FIG. 1D
FIG. 1C
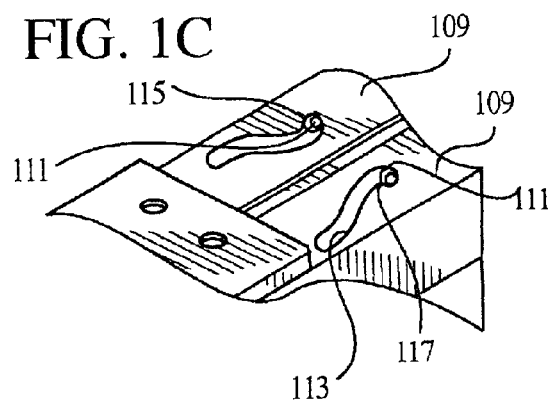

THERMAL CONNECTION LAYER

The present application claims priority from U.S. provisional patent application, Ser. No. 60/271,273, filed Feb. 22, 2001, which is incorporated herein by reference for all purposes.

This invention relates generally to cooling systems for heat-generating devices and, more particularly, to a thermal connector system for providing heat sink cooling to a heat-producing device.

The continued development of the microprocessor has led to significant increases in power dissipation requirements. System level performance requirements have resulted in computer systems that feature increasing numbers of microprocessors at very close proximity. The increase in system microprocessor count has reduced board to board spacing and, as a result, the available space available for thermal apparatus of computer systems.

A typical processor board can contain a multiplicity of CPU modules with associated cache memory, ASICs, and DC-DC converters. The total power dissipation from a similarly configured board can reach more than 600 W. Similar components can exist on each side of a board. With microprocessor power dissipation continuing to increase while the space available for a thermal solution decreases, it becomes necessary to consider alternative means to remove the heat dissipated by the CPU and associated components. One such alternative means is a single-phase forced-liquid cooling system, which is also known as a liquid loop.

The primary components of a liquid loop are a pump, a heat exchanger, a liquid-cooled cold plate and some associated tubing required to interconnect the components and put them in fluid communication (i.e., provide passageways and/or orifices for fluid to travel between the components). Heat is dissipated by the microprocessor, and/or other power consuming component, and transferred to the liquid circulating through the cold plate, with which the component is in intimate contact. The liquid increases in temperature sensibly (i.e., without changing its phase) as it absorbs heat. The liquid is then moved to the heat exchanger via the pump where the heat is transferred into the cooling air, resulting in a reduction in temperature of the liquid. The cycle is repeated when the liquid, also called the working fluid, enters the cold plate. A typical liquid for this type of application is a solution of ethylene glycol (60% volume) and water.

A disadvantage of employing a liquid loop to cool a computer system is the weight and bulk of the liquid loop assembly, which can exceed 30 lbs. per 600 W processor board. The primary contributions to assembly weight come from the heat exchanger, pump, liquid and cold plates.

The serviceability of computer system components, including processor boards, is an important feature of midrange to high end computer systems. The serviceability of a processor board that contained a liquid loop would be oppressive due to the excessive weight of the processor board, in combination with the liquid loop, and the inability of the processor to be quickly and easily detached from the cold plate.

In addition to serviceability, system reliability is of primary importance for business-critical, highly available, computer systems. System reliability is significantly increased by employing redundant components when necessary. The pump in a liquid loop is considered to be one of the least reliable components in a computer system and is therefore a prime candidate for redundancy. The addition of multiple redundant pumps to a liquid loop would further increase the weight of the assembly and hinder the serviceability requirement.

Prior high-capacity system-level thermal solutions have used forced air convection over high-surface-area heat sinks to dissipate heat. Since high-surface-area, air-cooled heat sinks require a large volume, which necessitates an increased board-to-board pitch, other thermal attempted solutions have utilized single phase liquid loops with cold plates rigidly mounted to the power dissipating components with fixed mechanical fasteners to ensure good thermal contact between the cold plates and processors. When servicing is required, the cold plates must be detached from the processors by means of elaborate tools. Therefore, these solutions all require that the system be shut down prior to removal of the cooled component thus hindering serviceability and limiting system availability.

Accordingly, there has existed a need for a thermal connection system for providing heat-sink cooling to a heat-producing device. The thermal connection system has low thermal resistance, and is preferably easily detachable to allow for ease of serviceability in a liquid loop commuter cooling system. Preferred embodiments of the present invention satisfy these and other needs, and provide further related advantages.

SUMMARY OF THE INVENTION

In various embodiments, the present invention solves some or all of the needs mentioned above by providing a cooling system that efficiently operates on one or possibly more high-dissipation devices with relatively simple maintenance. The combination of serviceability, reliability and redundancy make it highly desirable to de-couple a liquid loop assembly from electronics, thereby enabling easy removal of the processor board. This de-coupling can occur at the interface of the processor board and cold plates by means of a thermal connector. Such de-coupling would facilitate On-Line-Replacement of processor boards to further enhance system availability.

Cooling systems of the invention are typically configured for cooling a printed circuit assembly ("PC assembly"), such as circuit board including a first heat source and a second heat source of a plurality of heat sources. The invention includes a layer of thermally conductive material applied to the circuit board, the layer in conforming thermal contact with the first and second heat sources. It also includes a thermal conduit in thermal contact with the layer, the thermal conduit being configured for dissipating heat from the layer. Advantageously, the layer of the invention provides a single, unitary body for passing heat to the thermal conduit, the heat being dissipated from the heat sources. This single unitary layer can either be easily brought into contact with the heat sources, or it can provide for a simple contact means for the thermal conduit.

Preferably the body is either adequately compliant so as to adapt to differences in the heights and/or positions of the heat sources, or it is solidified or otherwise conformingly formed onto the heat sources so as to provide thermal communication without significant thermal impedance from gaps between the layer and the heat sources. This feature advantageously limits thermal impedance from size or tolerance issues.

The layer of the invention further features a composition of thermally conductive foam that has been conformingly received over, and preferably solidified on to, the first and second heat sources. This feature advantageously allows for the use of an actuator configured to actuate a cooled body into conforming thermal contact with the layer. Using such a layer, a single cooled body can cool a large number of heat sources.

The invention also features passageways, defined in the layer, which are configured for the passage of cooling fluid. The passageways thus form at least part of the thermal conduit. When used with quick-connect ports that allow for the quick and relatively dripless connection and/or disconnection of the passageways from a liquid loop, this feature provides for a combined circuit board cooling system that can be quickly and efficiently removed and replaced.

Other features and advantages of the invention will become apparent from the following detailed description of the preferred embodiments, taken with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

BRIEF DESCRIPTION OF THE DRAWINGS

FIG. 1A is a perspective view of a first embodiment of a cooling system embodying the present invention.

FIG. 1B is an enlarged partial view of FIG. 1A.

FIG. 1C is an enlarged partial view of FIG. 1A.

FIG. 1D is a cut-away perspective view of the embodiment depicted in FIG. 1A.

DETAILED DESCRIPTION OF THE PREFERRED EMBODIMENTS

Figure 2:
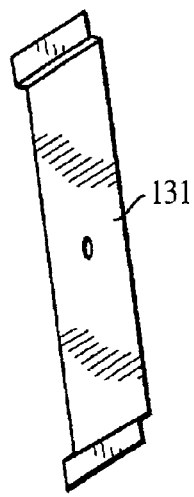
FIG. 2 is a perspective view of a Gimbaled Beam Spring, as provided in the embodiment depicted in FIG. 1A.
Figure 3:
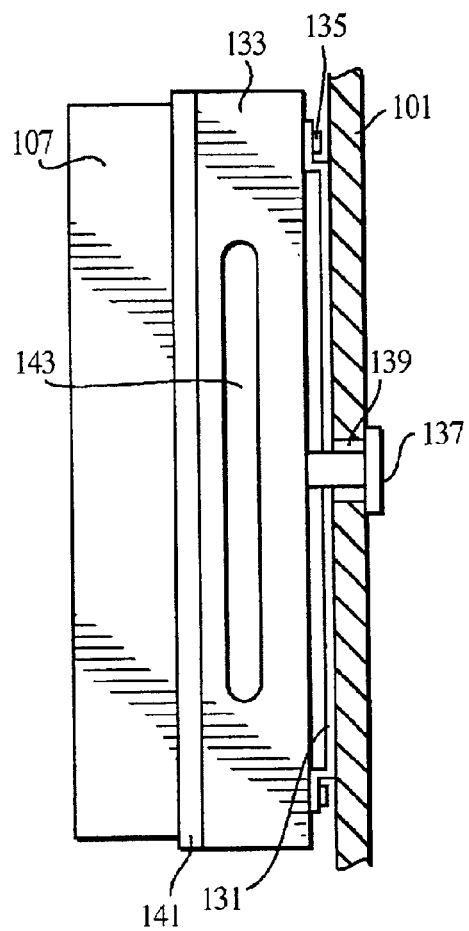
FIG. 3 is a partial side cross-sectional view of a cold plate compressed against a component by an actuation plate, as provided in the embodiment depicted in FIG. 1A.

The invention summarized above and defined by the enumerated claims may be better understood by referring to the following detailed description, which should be read with the accompanying drawings. This detailed description of particular preferred embodiments of the invention, set out below to enable one to build and use particular implementations of the invention, is not intended to limit the enumerated claims, but rather it is intended to provide particular examples of them.

Typical embodiments of the present invention reside in an innovative mechanism for the de-coupling of some or all of a heat sink infrastructure (preferably being a liquid loop) from heat-producing components, potentially facilitating the rapid, on-line serviceability of the system. Such embodiments typically alleviate the extended downtime that can occur while providing maintenance on bulky systems that often include redundant critical components. In a time-sensitive environment, such an embodiment can allow mission-critical applications to suffer only minimal downtime while providing for easy and expedient on-line replacement of failed parts. In preferred embodiments, heat absorbing components can be quickly and easily de-coupled from the heat-producing components and processor boards, sometimes enabling servicing of the boards without having to shut down the overall system.

With reference to FIGS. 1A, 1B, 1C and 1D, attached to a substantially planar backplane 100, the first embodiment of the invention comprises preferably two substantially planar actuation plates 101. The backplane includes a high-speed electrical connector 103 configured for connecting with a substantially planar processor board 105 having heat-producing components 107. The connector places the components in communication with a computer system. The actuation plates sandwich the processor board, and ride on rails 109 above and below the processor board. The rails are mounted to the backplane, and serve to attach the actuation plates to the backplane.

The actuation plates include guide pins 111 that slide in grooves 113 cut into the rails. Each groove forms a cam with each guide pin acting as cam followers in one groove. The combination of the cams and cam followers are designed to move the actuation plates in a lateral direction toward or away from the processor board (i.e., having a translational component normal to the plane of the processor board), preferably by at least 0.070 lateral inches, as they move longitudinally toward or away from the backplane 100. The lateral movement provides clearance for the insertion and removal of the processor board from between the actuation plates.

The groove 113 defines two types of cam surfaces formed in the groove: an outer cam surface configured for movement of the actuation plates in a positive lateral direction toward the processor board as the actuation plate moves toward the backplane, and an inner cam surface configured for movement of the actuation plates in a negative lateral direction away from the processor board as the actuation plate moves away from the backplane.

Ball bearings 115 are pressed onto the pins 111 and ride between the pin and the groove 113 to reduce the sliding friction of the mechanism. A bump feature 117 incorporated into the lateral shape of the groove (see, FIG. 1C), and functions as a positive, tactile feedback device to aid the user in determining when the plates are correctly engaged.

Actuation levers 119 are rotatably attached to the actuation plate 101. As the levers are rotated, they press against cam surfaces 121 attached to the rails 109 and produce force to move the actuation plates in a longitudinal direction (e.g., an insertion and removal direction for the processor board 105 with respect to the connector, being substantially normal to the plane of the backplane). Handles 123 are mounted to the actuation levers to provide leverage for actuating the actuation plates.

With reference to FIGS. 1A, 1D, 2 and 3, attached to the actuation plates 101 are one or more assemblies that each includes a gimbaled beam spring 131 and a cold plate 133. The cold plates are rigidly mounted to the springs with two or four screws 135, depending upon the preferred degree of spring stiffness in the beam spring. The cold plate/spring assembly is preferably attached to the actuation plate 101 by a single screw 137 protruding through the center of the beam spring. The screw is inserted into an oversized hole 139 in the actuation plate, preferably allowing the spring/cold plate assembly to move in a gimbaled manner.

In use, when the actuation plates 101 move laterally toward the processor board 105, the cold plates 133 contact the board components 107, with which they are positioned to align. With the cold plates contacting the components, the beam springs 131 are caused to compress by the further lateral translation of the actuation plates. As the springs compress, they force the cold plates into the board components, thereby increasing the contact force and improving thermal transmission performance between the components and the cold plates by reducing thermal contact resistance. At least 5 PSI of pressure is preferably developed between the cold plate and board component to ensure adequate thermal contact. Since the spring is gimbaled, the cold plate can adjust to component surfaces that do not lie in precisely the same plane as the actuation plate, further improving thermal contact and performance. An interface pad 141, such as Q-PAD 3 ® from the Bergquist Company, or a similar material with low thermal resistance and poor surface adhesion on one side, is preferably placed between the cold plate and the component. Alternatively, some other thermally conductive interface material, such as a thermally conductive grease, could be used.

The cold plates 133 are preferably part of a liquid loop cooling system. They are configured with internal passageways that are preferably interconnected in series by flexible silicone tubing 143 (such as TYGON ® Sanitary Silicone Tubing by Norton Performance Plastics Corp.) that is long lasting and can withstand the properties of the working fluid. The working fluid is pumped through the tubes to cool the cold plates and thereby cool the components. A heat exchanger (not shown) and pump (not shown) are preferably located remotely from the processor board and may service multiple assemblies of this type. The heat exchanger may be a roll bond panel, as described in U.S. Pat. No. 6,115,251, which is incorporated herein by reference for all purposes. Alternatively, the roll bond panel could be located adjacent the processor board, or could form the cold plates themselves.

In this embodiment, the cam groove is designed to transform the longitudinal directional movement of the actuation plate, resulting from a rotation of the actuation levers, into both longitudinal and lateral directional movement. The longitudinal translation facilitates shearing of the interface pads between the cold plates and the components during de-actuation, which is used to reduce the thermal contact resistance between the cold plate and component. This feature typically eases the separation of the cold plate from the component, which can be difficult due to surface adhesion of the interface material.

This shearing feature, in combination with friction, also serves to disconnect the processor board from the high-speed connectors 103, which are mounted to the backplane 100, ensuring that the board is not powered up without the thermal connection. This can also be achieved by means of a switch, attached to the backplane, that comes in contact with the actuation plates upon engagement. Upon disengagement, contact with the switch is lost and power to the board can be quickly, but in a controlled manner, turned off. A solenoid can be used to keep the board from ejecting with the actuation panel until the power is turned off.

In this first embodiment, a separate, dedicated cold plate 133 is preferably used to cool each heat-producing component 107. The cold plates are thus considered adaptive in this embodiment, as they do not require their height off the processor board to be based upon a single component, which would reduce thermal performance for the other components. Instead, their heights (i.e., distances off the board) can each be set based upon the heights of their respective chips. Preferably this means that they are referenced against a stop (i.e., placed against something to control the height),which will typically be the chip itself.

In a variation of this first embodiment, multiple heat-producing components 107 can be configured to share one or more cold plates. In such an embodiment various means can be used to reference the height of the cold plates. For example, either the hottest component or the tallest component could be used to reference the actuation distance of the cold plate. Alternatively, other height-adaptive apparatus could be used, such as those described below with respect to further embodiments.

Typical embodiments of the invention are reasonably small, and might for example, require two inches or less space in the lateral direction. This allows processor boards to be placed on a two-inch pitch, which is preferable for high speed system design. In addition, the assembly might be able to remove 600 W or more of heat when connected to an appropriate pump and heat exchanger, while keeping the component junction temperatures within reasonable operating ranges (typically less than 85 C.).

This first preferred embodiment of the invention features the structural de-coupling of a liquid loop infrastructure from a processor board, thus providing for lightweight and easily serviceable processor boards. The cold plates are capable of independently and adaptively referencing heat-producing components, providing for the minimization of cold plate bond lines and, therefore, the thermal resistance. Interface shearing is preferably used to facilitate de-coupling of the cold plate and heat-producing device, and further to provide assistance in disengaging the board from the system. Such disengaging can further provide an automatic disconnection of power to the processor board upon disengagement of the thermal connector via a switch mounted to the backplane and a solenoid. Preferred embodiments are envisioned to typically provide for pump redundancy, a 2-inch processor board pitch, and a 600 W removal capability at an 85° C. device junction temperature.

Variations of the above-described embodiment can be adapted for single-sided or multi-sided processor boards. In a first variation of the first embodiment, a cold plate on one or each side of the board could be configured to interface with a plurality of components rather than just a single one. In such a variation, the cold plate preferably sets its distance from the board based upon the height (i.e., distance off the board), of either the hottest or tallest component from among the plurality of components. Preferably this means that the cold plate is referenced against a stop (i.e., placed against something to control the height), which is typically the chip itself. A compressible interface material can be used elsewhere to take up the tolerance gap that can occur in such a non-adaptive design.

In a second variation of the first embodiment, a cooling system can be configured to be adaptive to a generic processor board. For such a system, to deal with components of arbitrary heights, the separation distance between the actuation panel and processor board can be increased so that all board components clear the cold plates when the assembly is in its de-actuated state. This might increase the processor board pitch beyond 2 inches.

In a third variation of the first embodiment, springs of various stiffness can be utilized to account for a multiplicity of unique cold plate to component spacings.

In a fourth variation of the first embodiment, the cold plates could be the evaporators of a refrigerated loop rather than part of a standard liquid loop. Likewise, in a fifth variation of the first embodiment, the cold plates could be conduction-cooled actuation plates. In a sixth variation of the first embodiment, the cold plates could be cooled by means of evaporative spray cooling utilizing any of a variety of spray cooling technologies. The use of other cooling technologies are also envisioned.

In a seventh variation of the first embodiment, being particularly appropriate for lower power applications having limited available space in which to place heat sinks and/or maintain airflow, interface material can be attached directly to the actuation panels, thereby conducting heat directly into the actuation panels from the hot device. Heat is thereby transferred to the panel and spread through the panel's large surface area, eventually being dissipated to the air via natural or forced convection.

In an eighth variation of the first embodiment, other mechanisms are envisioned for actuating cold plates laterally and/or longitudinally. For example, various types of hinges, screw drives, solenoids, levers, compliant latches and the like could actuate the actuation plates rather than the actuation levers and cams. Furthermore, the cold plates could be actuated directly rather than having one or more of them actuated on an actuation plate. Various forms of biasing springs and/or actuation stops can be used as means to provide for adequate pressure for good thermal contact between the cold plates and components, while preventing the cold plates from being driven into the components with excessive force.

Figure 4:
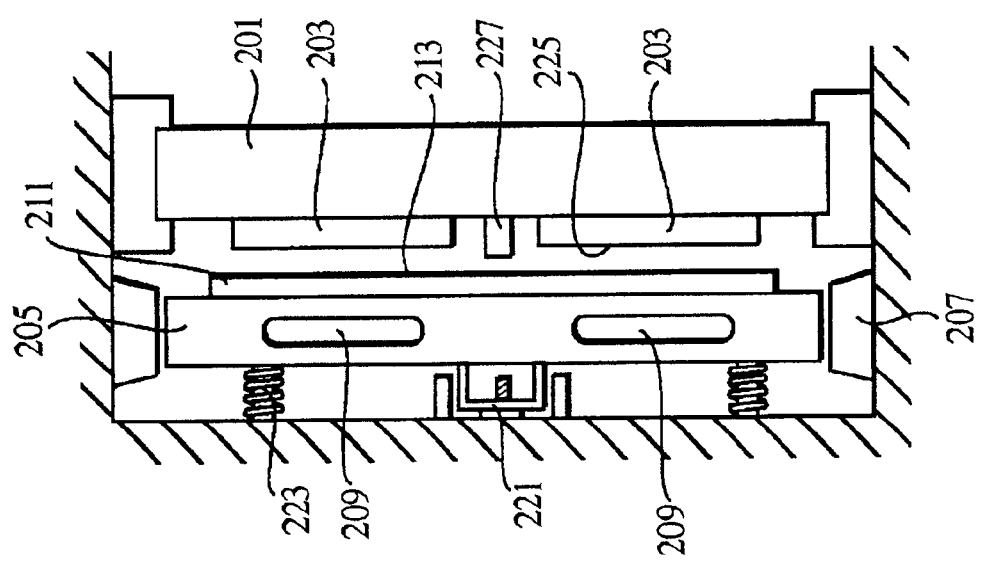
FIG. 4 is a cross-sectional, front elevation view of a second embodiment of a cooling system embodying the present invention.

With reference to FIG. 4, in a second embodiment of the invention, a processor board 201 having heat-producing components 203 on one side can be cooled by a single cold plate 205. The cold plate can translate laterally along guides 207, and includes passages for working fluids, the passages being connected by tubes 209. The cold plate includes a thermally conductive body 211 composed of a compliant, gap-filling material, defining a contact surface 213 configured for thermally contacting the heat-producing components. This body 211 forms a compliant layer of thermally conductive material (i.e., a thermal interface) configured to adaptively place the cold plate in thermal communication with each heat-producing component, regardless of variations in its height off the processor board. The compliant layer of thermally conductive material is preferably a gap-filling thermal foam, which can adapt to surface and height variations. Preferably the compliant layer of thermally conductive material is adhesively affixed to the cold plate, and the contact surface is not adhesive. For processor boards having heat-producing components on both sides of the board, a second cold palate can be mounted on the other side of the board using a mirrored configuration.

Similar to the first embodiment, cold plates 205 of the second embodiment are configured to laterally actuate toward and away from the processor board 201. Any of a wide variety of actuation means can be used, such as the actuation mechanisms described for the first embodiment. In the depicted actuation mechanism, a screw drive 221 actuates the cold plate from a central location, while a plurality of spring loaded pins 223 guide the movement and slight rotation of the cold plate. One alternative in the variety of actuation means is a quarter turn fastener, which could include a finger tightening grip or, more preferably, a receptacle for a turning tool.

The actuation mechanism compresses the contact surface 213 of the compliant layer of thermally conductive material against contact surfaces 225 of the heat-producing components 203 to assure good thermal communication between the cold plate 205 and each heat-producing component. Preferably, one or more stops 227 block the cold plate from pressing against the components with excessive force.

Figure 5:
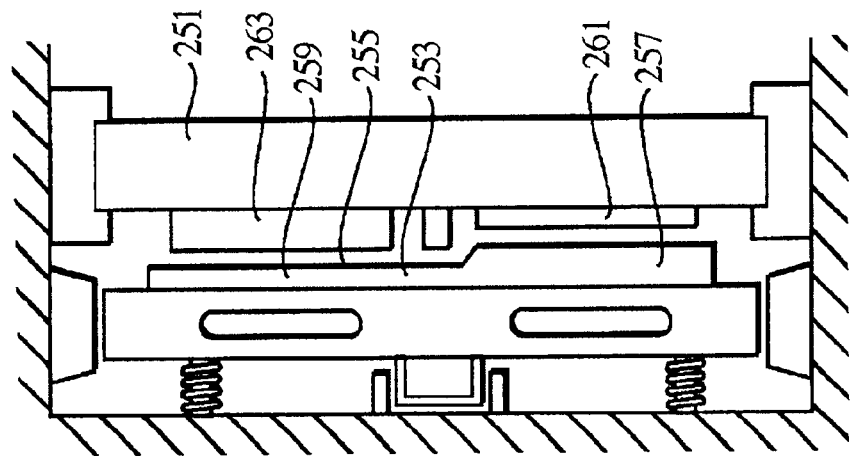
FIG. 5 is a cross-sectional, front elevation view of a variation of the embodiment depicted in FIG. 4.

With reference to FIG. 5, a variation of the second embodiment is adapted for processor boards 251 having large differences in component heights. In particular, preferably the body forming a compliant layer of thermally conductive material 253 is configured with varying thickness so as to form a contact surface 255 having various heights off the cold plate, making the contact surface a non-planar surface. In other words, preferably the compliant layer of thermally conductive material has a thick portion 257 and a thin portion 259 configured to contact a thin component 261 and a thick component 263, respectively. Preferably the non-planar surface substantially conforms to the respective heights of the heat-producing components that it is configured to contact, thus adapting to their different heights.

Figure 6:
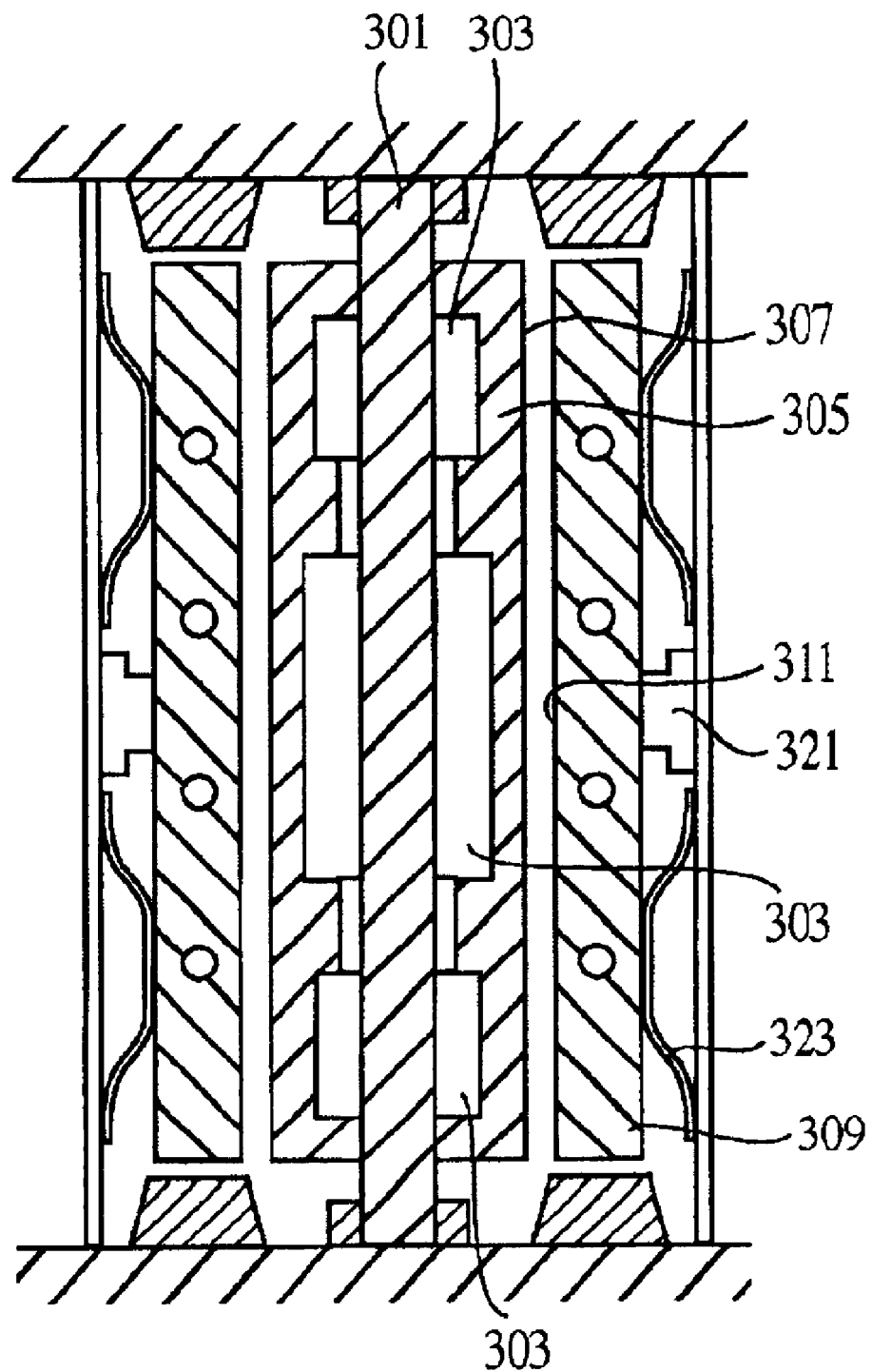
FIG. 6 is a cross-sectional, front elevation view of a third embodiment of a cooling system embodying the present invention.

With reference to FIG. 6, in a third embodiment of the invention, a processor board 301 carrying a plurality of heat-producing components 303 of different heights can include a layer of thermally conductive material 305 (i.e., a thermal interface) defining a single thermal-connection surface 307. The layer of thermally conductive material could be compliant or could be relatively rigid. Preferably the layer is formed by the process of spreading a liquid (i.e., not-yet solidified), gap-filling foam on the processor board, and letting it harden/solidify to partially encapsulate the heat-producing components. The thermal-connection surface is preferably a flat surface extending substantially parallel to the plane of the processor board. If the processor board includes heat-producing components on opposite sides of the board, as depicted, then a layer of thermally conductive material is preferably applied to each side of the processor board, effectively encapsulating a substantial portion of the processor board.

Similar to the first embodiment, cold plates 309 of the third embodiment are configured to laterally actuate toward and away from the processor board. Any of a wide variety of the actuation means can be used, such as the actuation mechanisms described for the first embodiment. The cold plates have a cooling surface 311 that substantially conforms to the thermal-connection surface 307 of the layer of thermally conductive material 305. An interface material, such as grease or an interface pad, can be used to improve thermal conductivity between the two conforming surfaces, particularly if they are both rigid.

The actuation mechanism compresses the contact surface 307 of the layer of thermally conductive material 305 against the cooling surface 311 of the cold plates 309 to assure good thermal communication between the cold plate 309 and each heat-producing component. The actuation mechanism includes a solenoid 321 and springs 323.

It is noteworthy that the third embodiment is distinct from the first two embodiments in the fact that it includes a processor board itself is configured with a layer of thermally conductive material. The first two embodiments are configured for use with processor boards that do not necessarily include thermal accommodations such as an adaptive thermal interface.

Figure 7:
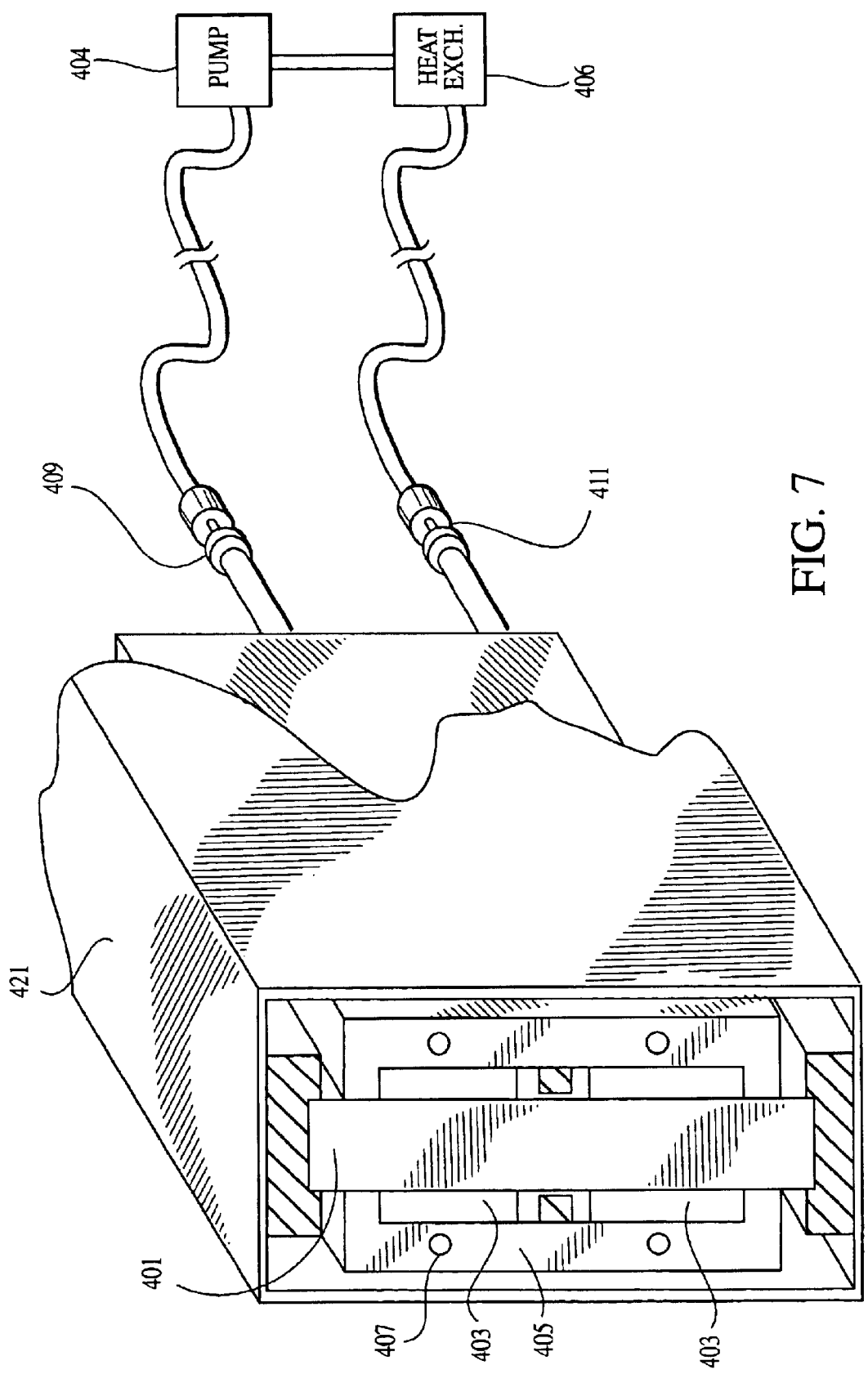
FIG. 7 is a cross-sectional, perspective view of a fourth embodiment of a cooling system embodying the present invention.

With reference to FIG. 7, in a fourth embodiment of the invention, a processor board 401 carrying a plurality of heat-producing components 403 of potentially different heights includes an entirely self-contained system for connection to a liquid loop, including a pump 404 and a heat exchanger 406. Similar to the third embodiment, the processor board includes a layer of thermally conductive material 405 (i.e., a thermal interface) at least partially encapsulating heat-producing components on each side of the board having such components. The layer of thermally conductive material is of a relatively thermally conductive material such as metal (having excellent thermal conductivity) or thermally conductive foam (typically being more economical to use). The layer can be machined to shape and attached by adhesion or structural support. Alternatively, the layer can be formed by applying a liquid/not-yet-solidified foam, and having it solidify.

Each layer of thermally conductive material includes passageways 407, preferably containing thermally conductive tubing to carry the working fluid of the liquid loop. The passageways could be formed into the layer when it is first solidified and/or cast (such as by forming the layer around preformed tubing), or they could be machined in after the layer is formed. All of the passageways are preferably serially connected from an input port 409 to an output port 411 using tubes (not shown in this embodiment to leave passageways 407 visible). The input and output ports are preferably dripless quick-disconnect ports that are configured to mate with appropriate mating ports on a main board.

Preferably, the fourth embodiment is configured with electrical connectors (not shown) and liquid-loop, dripless, quick-disconnect, cooling-fluid connectors that simultaneously connect and simultaneously disconnect for fast and easy replacement. Similar to the above-described embodiments, the electrical connectors and cooling connectors are preferably configured such that the cooling system does not disconnect prior or to the shut-down of the heat-producing components.

The fourth embodiment can include an enclosure 421 entirely enclosing the processor board and the layer of thermally conductive material, leaving only the electrical and liquid loop connectors exposed. Such an enclosure minimizes thermal communication between adjoining processor boards, and provides maximum protection for each processor board, both while it is being handled, and during operation.

It is to be understood that the invention comprises apparatus and methods for designing cooling systems and for producing cooling systems, as well as the apparatus and methods of the cooling system itself. Additionally, the various embodiments of the invention can incorporate various combinations of their features with computer systems and/or other systems incorporating cooling of hot components. Also, the above apparatus and methods could be adapted for use with other types of heat-producing components, such as in optical devices and the like. In short, the above disclosed features can be combined in a wide variety of configurations within the anticipated scope of the invention.

While particular forms of the invention have been illustrated and described, it will be apparent that various modifications can be made without departing from the spirit and scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

We claim:

1. A cooling system for cooling a circuit board including a first heat source and a second heat source, comprising:
   a layer of thermally conductive material in conforming thermal contact with the first and second heat sources;
   a thermal conduit in thermal contact with the layer, the thermal conduit being configured for dissipating heat from the layer; and
   an actuator configured to actuate the thermal conduit into thermal contact, via the layer, with the first and second heat sources.

2. The cooling system of claim 1, wherein the layer is composed of solidified foam conformingly received over the first and second heat sources.

3. The cooling system of claim 2, wherein the layer is composed of solidified foam formed by applying a coating of foam over the first and second heat sources prior to its solidification.

4. The cooling system of claim 1, wherein the actuator is configured to actuate the thermal conduit into conforming thermal contact with the layer.

5. The cooling system of claim 4, wherein the thermal conduit includes a roll bond panel.

6. The cooling system of claim 4, wherein the thermal conduit includes a body defining passageways configured for cooling fluid.

7. The cooling system of claim 6, and further comprising a pump and a heat exchanger in fluid communication with the passageways defined by the body to form a liquid loop cooling system.

8. The cooling system of claim 1, wherein the thermal conduit includes walls that define cooling fluid passageways through the layer.

9. The cooling system of claim 8, and further comprising a pump and a heat exchanger in fluid communication with the passageways through the layer to form a liquid loop cooling system.

10. The cooling system of claim 1, wherein the actuator is configured to actuate the layer into conforming thermal contact with the first and second heat sources.

11. The cooling system of claim 10, wherein the layer is configured with varied thickness to substantially conform to the first and second heat sources.

12. The cooling system of claim 10, wherein the thermal conduit includes a roll bond panel.

13. The cooling system of claim 10, wherein the thermal conduit includes a body defining passageways configured for cooling fluid.

14. A cooling system for cooling a circuit board including a first heat source and a second heat source, comprising:
   a means for transferring heat, being conforming thermal contact with the first and second heat sources;
   a thermal conduit in thermal contact with the means for transferring heat, the thermal conduit being configured for dissipating heat from the means for transferring heat; and
   an actuator configured to actuate the thermal conduit into thermal contact, via the means for transferring heat, with the first and second heat sources.

15. A cooling system of claim 14, wherein the means for transferring heat is a unitary pad of thermally conductive material.

16. A cooled circuit board system, comprising:
   a board configured for electrically connecting components for communication;
   a first component heat source mounted on and in electrical communication with the board;

a second component heat source mounted on and in electrical communication with the board;

a layer of thermally conductive material in conforming thermal contact with the first and second heat sources;

a thermal conduit in thermal contact with layer, the thermal conduit being configured for dissipating heat from the layer; and an actuator configured to actuate the thermal conduit into thermal contact, via the layer, with the first and second heat sources.

17. The cooled circuit board of claim 16, wherein the layer is composed of solidified foam conformingly received over the first and second heat sources.

18. The cooled circuit board of claim 17, wherein the layer is composed of solidified foam formed by applying a coating of foam over the first and second heat sources prior to its solidification.

19. The cooled circuit board of claim 16, wherein the actuator is configured to actuate the thermal conduit into conforming thermal contact with the layer.

20. The circuit board of claim 19, wherein the thermal conduit includes a roll bond panel.

21. The cooled circuit board of claim 19, wherein the thermal conduit includes a body defining passageways configured for cooling fluid.

22. The cooled circuit board of claim 21, and further comprising a pump and a heat exchanger in fluid communication with the passageways defined in the plate to form a liquid loop cooling system.

23. The cooled circuit board of claim 16, wherein the thermal conduit includes walls define cooling fluid passageways through the layer.

24. The cooled circuit board of claim 23, and further comprising a pump and a heat exchanger in fluid communication with the passageways through the layer to form a liquid loop cooling system.

25. The cooled circuit board system of claim 24, and further comprising:

a second board configured for electrically connecting components for communication;

a third component heat source mounted on and in electrical communication with the second board;

a fourth component heat source mounted on and in electrical communication with the second board;

a second layer of thermally conductive material in conforming thermal contact with the third and fourth heat sources;

a second thermal conduit in thermal contact with the second layer, the second thermal conduit being configured for dissipating heat from the second layer; and a second actuator configured to actuate the second thermal conduit into thermal contact, via the second layer, with the third and fourth heat sources;

wherein the second thermal conduit includes walls that define cooling fluid passageways through the second layer; and wherein the pump and the heat exchanger are also in fluid communication with the passageways through the second layer.

26. The cooled circuit board system of claim 16, wherein the actuator is configured to actuate the layer into conforming thermal contact with the first and second heat sources.

27. The cooling system of claim 26, wherein the layer is configured with varied thickness to substantially conform to the first and second heat sources.

28. The cooling system of claim 26, wherein the thermal conduit includes a roll bond panel.

29. The cooling system of claim 26, wherein the thermal conduit includes a body defining passageways configured for cooling fluid.

30. The cooling system of claim 26, wherein the first and second heat sources extend to different heights with respect to the circuit board, wherein:

the layer is configured to compliantly adapt to the difference between the heights of the first and second heat sources when the actuator is actuated to place the thermal conduit into thermal contact, via the layer, with the first and second heat sources.

31. The cooling system of claim 30, and further comprising a stop, wherein the stop is configured to limit the actuation of the thermal conduit so as to prevent the application of excessive force on the heat sources.

32. The cooling system of claim 19, wherein the first and second heat sources extend to different heights with respect to the circuit board, wherein:

the layer extends up from the heights of the first and second heat sources to a third height; and the actuator is configured to actuate the thermal conduit into contact with the layer at the third height.

33. The cooled circuit board system of claim 22, and further comprising:

a second board configured for electrically connecting components for communication;

a third component heat source mounted on and in electrical communication with the second board;

a fourth component heat source mounted on and in electrical communication with the second board;

a second layer of thermally conductive material in conforming thermal contact with the third and fourth heat sources;

a second thermal conduit in thermal contact with the second layer, the second thermal conduit being configured for dissipating heat form the second layer; and a second actuator configured to actuate the second thermal conduit into thermal contact with the second layer;

wherein the second thermal conduit includes a second body defining passageways configured for cooling fluid; and wherein the pump and the heat exchanger are also in fluid communication with the passageways defined by the second body.

* * * * *